United States Patent [19]

Kazumi et al.

[11] Patent Number: 4,507,519
[45] Date of Patent: Mar. 26, 1985

[54] PHOTOELECTRONIC CONVERSION DEVICE

[75] Inventors: Maruyama Kazumi; Uchida Yoshiyuki, both of Yokosuka, Japan

[73] Assignees: Fuji Electric Co., Ltd.; Fuji Electric Corporate Research & Development Co., Ltd., both of Japan

[21] Appl. No.: 462,878

[22] Filed: Feb. 1, 1983

[30] Foreign Application Priority Data

Feb. 9, 1982 [JP] Japan ................................ 57-19051

[51] Int. Cl.$^3$ ........................................... H01L 31/06
[52] U.S. Cl. .................................. 136/258; 136/244; 136/246; 357/30
[58] Field of Search ............... 136/256, 258 AM, 244; 357/2, 30

[56] References Cited

U.S. PATENT DOCUMENTS

| 4,064,521 | 12/1977 | Carlson | 357/2 |
| 4,281,208 | 7/1981 | Kuwano et al. | 136/249 |
| 4,292,092 | 9/1981 | Hanak | 148/1.5 |
| 4,450,316 | 5/1984 | Hamakawa et al. | 136/256 |

FOREIGN PATENT DOCUMENTS

| 0070509 | 1/1983 | European Pat. Off. | 136/258 AM |
| 2023929A | 1/1980 | United Kingdom | 136/244 |

OTHER PUBLICATIONS

D. E. Carlson, "Amorphous Silicon Solar Cells", *IEEE Trans Electron Devices*, ED-24, Apr. 1977, pp. 449-453.
D. E. Carlson, "Amorphous Silicon Solar Cells", *Quarterly Report No. 6, DOE Contrast EY-76-c-03-1286*, Jan. 1978, pp. 23-26.
O. Kuboi, "Degradation of ITO Film is Glow-Discharge Plasma", *Japanese J. Appl. Phys.*, 20(11), Nov. 1981, pp. L783-L786.

*Primary Examiner*—Aaron Weisstuch
*Attorney, Agent, or Firm*—Brumbaugh, Graves, Donohue & Raymond

[57] ABSTRACT

In the typical embodiment of the invention described herein, a photoelectronic conversion device comprises a transparent insulative substrate, a first transparent electrode layer of Sn-incorporated $In_2O_3$ having a relatively low sheet resistance and a thickness of about 1000 Å, a second transparent electrode layer of $SnO_2$ having a relatively high plasma resistance and a thickness of several tens to several hundreds of Angstroms, an amorphous semiconductor film formed by a plasma CVD process at a substrate temperature of about 200°-250° C., and a metal electrode.

15 Claims, 7 Drawing Figures

PHOTOELECTRONIC CONVERSION DEVICE

BACKGROUND OF THE INVENTION

This invention concerns a structure for a photoelectronic conversion device and, more particularly, a photoelectronic conversion device such as a photosensor which is adapted to convert the energy of light into electrical energy for use as a power source or for sensing.

Heretofore, crystalline semiconductors have been employed as semiconductor materials. It has recently been found that amorphous semiconductors (a-Si:H, a-Si:Fi:H, a-Si:C:H, a-Si:Ge:H, etc.) can also be used as the semiconductor materials and that photoelectronic conversion devices as described above can be manufactured with amorphous semiconductors at reduced cost.

BRIEF SUMMARY OF THE INVENTION

In accordance with the present invention, a photoelectronic conversion device comprises an amorphous semiconductor film formed on a transparent electrode on a transparent insulative substrate, said transparent electrode comprising a laminated structure of at least two layers, one layer in contact with the amorphous semiconductor film being made of plasma-resistant material and another layer in contact with the first layer exhibiting a low sheet resistance.

DETAILED DESCRIPTION OF PREFERRED EMBODIMENT

Figure 1:
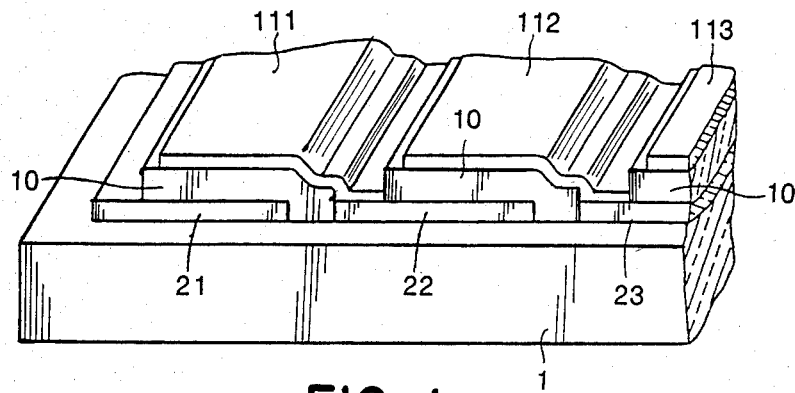
FIG. 1 is a perspective view showing a conventional photoelectronic conversion device.

One example of a photoelectronic conversion device using an amorphous semiconductor is a conversion device using a transparent insulative substrate, for example, glass. FIG. 1 shows one example for the structure of a conventional solar cell using amorphous silicon of the above-specified type. In FIG. 1 a glass substrate 1 has three spaced ITO (Sn-incorporated $In_2O_3$) transparent electrodes 21-23, on which amorphous silicon (a-Si) films 10 of a pin structure are formed. Three metal electrodes 111-113, spaced so as to be disposed above transparent electrodes 21-23 respectively, are formed on the a-Si film 10 to provide corresponding electronic conversion regions, and each metal electrode 111, 112 is partially in contact with the transparent electrode 22, 23 of the photoelectronic conversion region in the succeeding stage, so that individual photoelectronic conversion regions 21, 111; 22; 112 and 23; 113 are connected in series.

In the device of FIG. 1, metal electrode and the transparent electrode which are partially in contact (for example, 111 and 22) are connected with their contacting portions being completely overlapped so that the loss in the cell may be decreased and electric current may be conducted to an external circuit without substantial resistance. In this way, the path of the current flowing laterally in the transparent electrode, which has a relatively high sheet resistance, can be made short and, accordingly, the power loss in the transparent electrode can be minimized.

Figure 2:
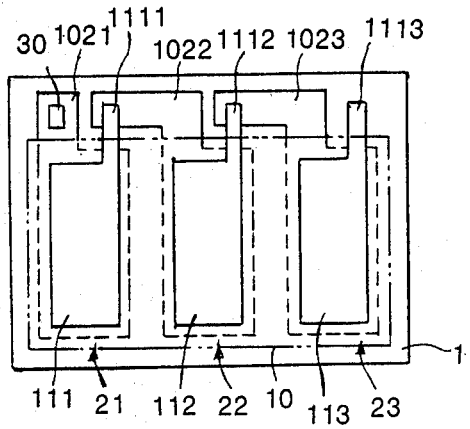
FIG. 2 is a plan view of another conventional photoelectronic conversion device.

FIG. 2 shows a conventional photoelectronic conversion structure for use under a low luminosity, such as ordinary room illumination, in which corresponding elements have the same reference numerals used in FIG. 1. In this case, since the current generated is low, there is no problem of power loss in the transparent electrode, and a connection between adjacent photoelectronic conversion regions is made only between portions of metal electrodes 1111, 1112 and portions of transparent electrodes 1022, 1023 of the adjacent region that are extended to the outside of the a-Si films 10. A metal pad 30 is provided on the portion 1021 for attachment of one of the external leads (not shown) and the portion 1113 is used for attachment of the other external lead (not shown). The structure shown in FIG. 2 is preferable to the solar cell for use with room lights involving no internal power loss since it is easier to improve the area efficiency of this structure than of the structure shown in FIG. 1.

As mentioned above, an a-Si solar cell for a photoelectronic conversion device is prepared by forming an a-Si layer of a p-i-n structure on an ITO/glass substrate by way of a plasma CVD (chemical vapor deposition) process. The gas used as the material for the plasma CVD comprises silane ($SiH_4$), disilane ($Si_2H_6$) or fluorinated silane ($SiF_4$) which is at 100% concentration or diluted with $H_2$, He, Ne, Ar or the like as a basic gas, and a gas containing an element of group III such as $B_2H_6$ for the formation of a p-type layer and a gas of an element of group V such as $PH_3$ for the formation of an n-type layer added thereto.

The defect of conventional a-Si solar cells of the type described above resides in that a characteristic degradation occurs resulting from the exposure of the transparent electrode to the plasma during deposition of the a-Si layer or from the intrusion of an ITO ingredient (such as In) into the a-Si layer, which reduces the output characteristics of the solar cell. It has been confirmed that the former effect, i.e., the increase in the sheet resistance of ITO due to the plasma exposure, is attributable to the deposition of indium and tin alloy in ITO. That has also been confirmed for the latter effect, i.e., inclusion of indium into the a-Si layer. These phenomena can be suppressed by decreasing the substrate temperature during deposition of the a-Si layer.

In view of the above, it has heretofore been impossible to increase the temperature of the substrate above 200° C. during deposition of the a-Si layer on the ITO/glass substrate. Solar cell performance is decreased with a temperature higher than 200° C. On the other hand, it has been confirmed by examination of the substrate temperature-dependency of the output performance of an a-Si solar cell using a metal substrate such as stainless steel that the optimum substrate temperature is about 250° C. In other words, a temperature lower than 200° C. is out of the optimum range as the temperature for depositing the a-Si layer and thus a-Si can only be deposited under such unsatisfactory temperature conditions because of the problem with ITO as described above. Further, even if a-Si is deposited at a temperature lower than 200° C., the problem with ITO characteristics mentioned above is not solved completely. Thus, the performance of an a-Si solar cell can be improved even at low temperature deposition conditions by the use of a transparent electrode having a better plasma-resistance.

In accordance with the present invention, a transparent electrode structure is provided which eliminates the foregoing defects and results in a photoelectric conversion device having improved performance.

The present inventors have discovered that tin oxide ($SnO_2$) has a greater plasma-resistance than ITO upon deposition of the a-Si layer and less contamination effect on a-Si since it contains no indium.

Accordingly, by using tin oxide for the transparent electrode, the substrate temperature for deposition of a-Si thereon can be set to the optimum condition of 250° C. For instance, in the case of an a-Si solar cell having an area of several $mm^2$, the conversion efficiency of the cell prepared at a substrate temperature of 250° C. using tin oxide as the transparent electrode has been improved by about 30% as compared with a cell prepared at 190° C. using ITO as the transparent electrode. However, the superiority decreases as the cell area increases to values greater than 1 $cm^2$. This is due to the fact that the sheet resistance of the tin oxide is 5-10 times greater than that of ITO having the same film thickness, so that the increase in current generated as the cell area becomes greater increases the power loss in the transparent electrode and thereby reduces the conversion efficiency.

Since the transparent electrode also serves to prevent reflection, the optimum film thickness thereof is about 1000 Å. To obtain a sheet resistance for a tin oxide electrode substantially equal to that of ITO, it is necessary to increase the film thickness thereof to 5000-10000 Å, but such an approach cannot be taken in view of the reduction in the light transmission.

Figure 3:
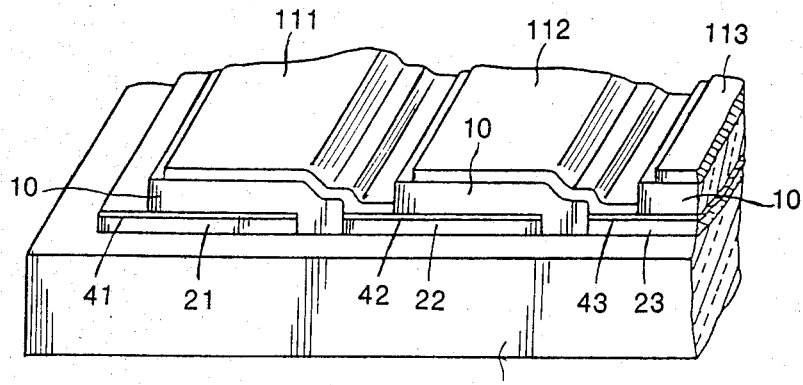
FIG. 3, FIG. 4 and FIG. 6 are perspective views showing different embodiments of photoelectronic conversion devices according to this invention.

FIG. 3 illustrates one embodiment of this invention in which a transparent electrode comprises a two-layered structure including first transparent electrodes 21-23 and second transparent electrodes 41-43, respectively. The first transparent electrode 21, 22, 23 is made of material with a low sheet resistance, for example, of ITO having about 1000 Å thickness and it is provided in order to lower the internal resistance of the transparent electrode system. The second transparent electrode 41, 42, 43 is provided to protect the first transparent electrode against the damage caused by plasma. It is made of material having a high plasma-resistance, such as $SnO_2$, and has thickenss from about several tens to several hundreds of Angstroms as required to accomplish that objective. Consequently, the sheet resistance of the second transparent electrode is 50-1000 times greater than that of the first transparent electrode.

Figure 4:
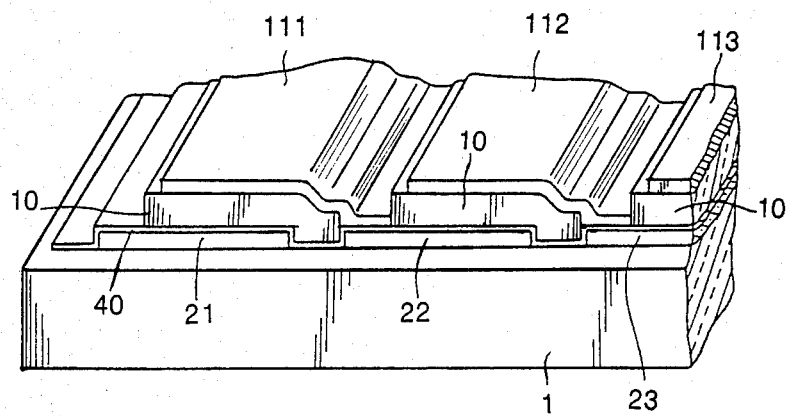

FIG. 4 shows a second embodiment of the invention, in which the second transparent electrode is not separated between adjacent regions but is formed as a continuous film 40. The first transparent electrodes (for example 21 and 22) can be substantially insulated from each other by the use of a second transparent electrode with a high sheet resistance, thereby avoiding any leakage problem.

Figure 5:
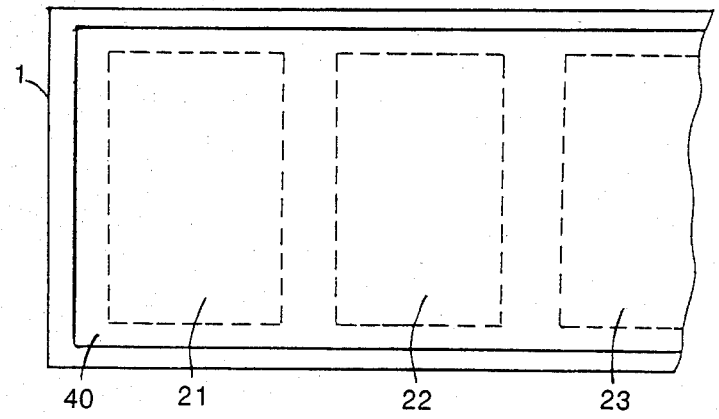
FIG. 5 is a plan view illustrating a further embodiment of the invention.

FIG. 5 shows a third embodiment of the invention as seen from above. In that embodiment the second transparent electrode 40, the first transparent electrodes 21-23, and a glass substrate 1 are arranged so that the second transparent electrode 40 completely covers the first transparent electrodes 21-23.

The structures shown in FIGS. 4 and 5 have the following further advantages:

(1) Where $SnO_2$ is used to provide the second electrode, no patterning step is necessary. This eliminates the difficulties which are encountered in patterning $SnO_2$ by way of etching.

(2) Glass ingredients, for example Na, can be prevented from intruding into the a-Si layer.

Figure 6:
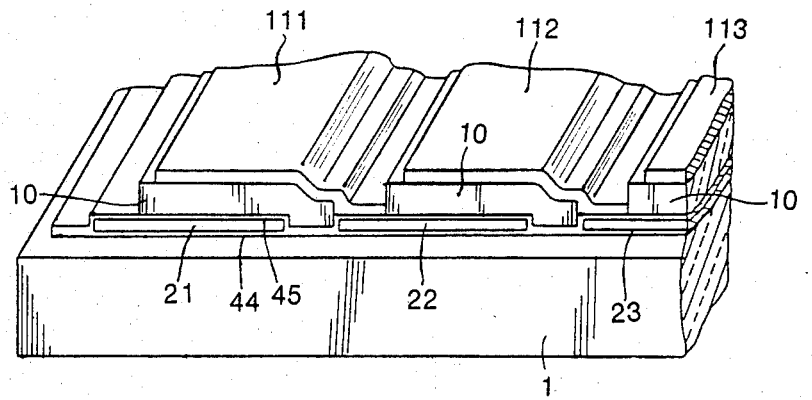

FIG. 6 shows a fourth embodiment, in which the lower and upper surfaces of each of the first transparent electrodes 21-23 are coated with second transparent electrodes 44, 45, respectively, to provide a composite transparent electrode having a three-layered structure. In this structure, the second advantage described above can be made more effective.

While the specific examples of this invention have been described with respect to structures of the type shown in FIG. 1, the same effects can also be obtained, of course, by using the transparent electrode of the invention in structures of the type shown in FIG. 2.

Further, it will be apparent that the invention is also effective in connection with a solar cell or a photosensor having a single photoelectronic conversion region on the substrate rather than a series of photoelectronic conversion regions which are connected in series as shown in FIGS. 1 and 2.

In order to confirm the advantageous effects of this invention, amorphous solar cells having a conventional structure of the type shown in FIG. 1 and cells having a structure according to the present invention, as shown in FIG. 3, were fabricated for test. Each group included cells in which the a-Si film was deposited at a substrate temperature of 200° C. and cells in which the deposition temperature was 250° C.

The transparent electrode of the solar cells made in accordance with FIG. 1 had an 800 Å ITO film and the transparent electrode of the solar cells made in accordance with FIG. 3 had a laminated structure with an 800 Å first transparent electrode and a 100 Å tin oxide second transparent electrode. An a-Si film consisting of a 100 Å p-type layer, a 500 Å non-doped layer (i layer) and a 500 Å n-type layer was formed on the transparent electrode by the plasma CVD process and, finally, a 1 $\mu$m aluminum electrode was formed by way of vacuum deposition.

Figure 7:
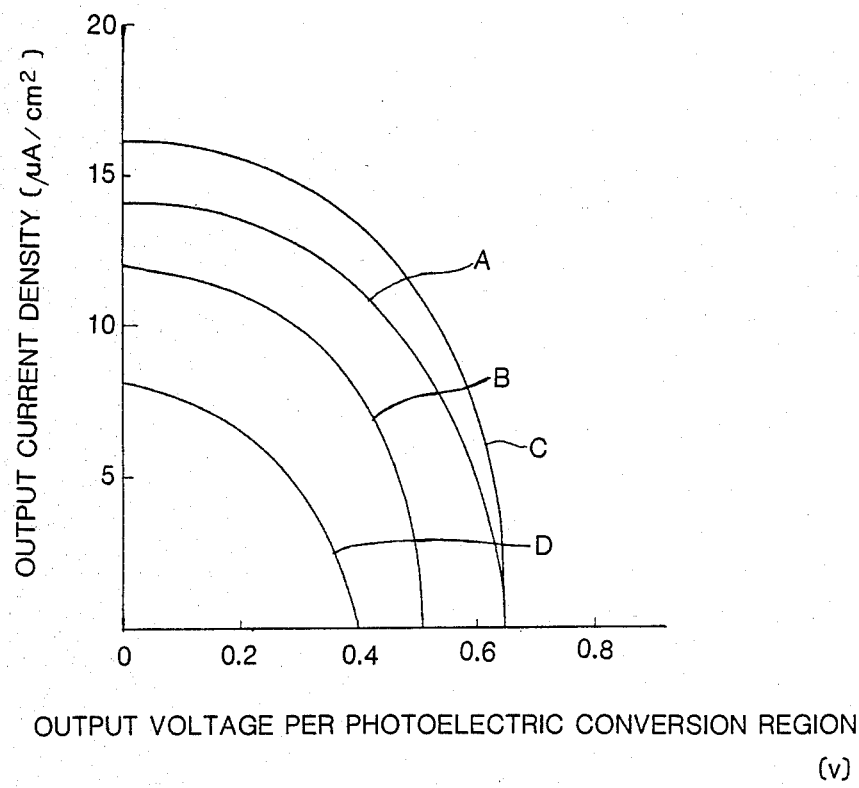
FIG. 7 is a graphical representation showing the characteristic curves of photoelectronic conversion devices of the invention and the prior art.

FIG. 7 shows the output characteristics of the two types of solar cells when irradiated with the light of white fluorescent lamps at 200 lux. Upon comparing the performance of the cells in which the a-Si film was deposited at a substrate temperature of 200° C., the characteristics of the solar cell having the structure shown in FIG. 3 according to this invention (curve A in FIG. 7) are superior to the characteristics of the conventional structure (curve B) both in short circuit current and open circuit voltage. Furthermore, the characteristics of the solar cell according to this invention in which the a-Si film was deposited at a substrate temperature of 250° C. (curve C) was improved by about 11% as compared with the corresponding cell having a film deposited at substrate temperature of 200° C. with respect to short circuit current, which demonstrates the advantageous effect of this invention. On the other hand, the test results confirmed that the characteristics of the solar cell having a conventional structure in which the a-Si film was deposited at 250° C. (curve D) are extremely poor.

We claim:

1. A photoelectronic conversion device comprising:

a transparent insulative substrate;

a first transparent electrode layer over said substrate, said first electrode layer having a relatively low sheet resistance;

a second transparent electrode layer on said first transparent electrode layer, said second electrode layer having a relatively high plasma resistance; and an amorphous semiconductor film on said second transparent electrode layer, wherein the second transparent electrode layer is also provided between the first transparent electrode layer and the substrate, in addition to between the first transparent electrode layer and the amorphous film.

2. The photoelectronic conversion device according to claim 1 wherein said first transparent electrode comprises Sn-incorporated $In_2O_3$ having a thickness of about 1000 Å.

3. The photoelectronic conversion device according to claim 1 wherein said second transparent electrode comprises $SnO_2$ having a thickness of several tens to several hundreds of Angstroms.

4. The photoelectronic conversion device according to claim 2 wherein said amorphous semiconductor film comprises a p-type layer having a thickness of about 100 Å, a non-doped layer having a thickness of about 500 Å, and an n-type layer having a thickness of about 500 Å, all formed by a plasma CVD process.

5. The photoelectronic conversion device according to claim 2 further including a metal electrode on said amorphous semiconductor film.

6. The photoelectronic conversion device according to claim 5 wherein said metal electrode comprises aluminum.

7. The photoelectronic conversion device according to claim 6 wherein said amorphous silicon layer is grown at a substrate temperature of about 200°–250° C.

8. The photoelectronic conversion device according to claim 2 wherein the first transparent electrode layer comprises a plurality of separate segments.

9. A photoelectronic conversion device comprising:

a transparent insulative substrate;

a first transparent electrode layer on said substrate, said first electrode layer having a relatively low sheet resistance;

a second transparent electrode layer on said first transparent electrode layer, said second electrode layer having a relatively high plasma resistance; and an amorphous semiconductor film on said second transparent electrode layer, wherein the first transparent electrode layer comprises a plurality of separate segments and the second transparent electrode layer comprises a substantially continuous sheet over said separate first electrode segments.

10. The photoelectronic conversion device according to claim 9 wherein said first transparent electrode comprises Sn-incorporated $In_2O_3$ having a thickness of about 1000 Å.

11. The photoelectronic conversion device according to claim 9 wherein said second transparent electrode comprises $SnO_2$ having a thickness of several tens to several hundreds of Angstroms.

12. The photoelectronic conversion device according to claim 9 wherein said amorphous semiconductor film comprises a p-type layer having a thickness of about 100 Å, a non-doped layer having a thickness of about 500 Å, and an n-type layer having a thickness of about 500 Å, all formed by a plasma CVD process.

13. The photoelectronic conversion device according to claim 9 further including a metal electrode on said amorphous semiconductor film.

14. The photoelectronic conversion device according to claim 13 wherein said metal electrode comprises aluminum.

15. The photoelectronic conversion device according to claim 13 wherein said amorphous silicon layer is grown at a substrate temperature of about 200°–250° C.

* * * * *

UNITED STATES PATENT AND TRADEMARK OFFICE
CERTIFICATE OF CORRECTION

PATENT NO. : 4,507,519

DATED : March 26, 1985

INVENTOR(S) : Kazumi Maruyama et al.

It is certified that error appears in the above-identified patent and that said Letters Patent is hereby corrected as shown below:

First page, Item 75, "Maruyama Kazumi; Uchida Yoshiyuki" should read --Kazumi Maruyama; Yoshiyuki Uchida--;
  Column 4, line 39, after "800 Å" insert --ITO--;
  Column 5, line 27, "claim 2" should read --claim 1--;
  Column 5, line 34, "claim 2" should read --claim 1--; and
  Column 5, line 41, "claim 6" should read --claim 5--.

Signed and Sealed this

Seventeenth Day of September 1985

[SEAL]

Attest:

DONALD J. QUIGG

Attesting Officer

Commissioner of Patents and
Trademarks—Designate